(12) United States Patent
Huang et al.

(10) Patent No.: US 12,117,586 B2
(45) Date of Patent: Oct. 15, 2024

(54) PROXIMITY SENSOR (71) Applicant: Vishay Semiconductor GmbH, Heilbronn D (DE)

(72) Inventors: Cheng Chieh Huang, Taipei (TW); Yu Hao Kao, New Taipei (TW); Koon-Wing Tsang, Fremont, CA (US)

(73) Assignee: Vishay Semiconductor GmbH, Heilbronn D (DE)

( * ) Notice: Subject to any disclaimer, the term of this patent is extended or adjusted under 35 U.S.C. 154(b) by 445 days.

(21) Appl. No.: 17/589,184

(22) Filed: Jan. 31, 2022

(65) Prior Publication Data

US 2023/0243999 A1 Aug. 3, 2023

(51) Int. Cl.
*G01V 8/12* (2006.01)
(52) U.S. Cl.
CPC ...................... *G01V 8/12* (2013.01)
(58) Field of Classification Search
CPC ............. G01V 8/12; H03K 2017/9455; H03K 2217/94108; H03K 2217/94111; H03K 2217/94116; H03K 17/943
See application file for complete search history.

(56) References Cited

U.S. PATENT DOCUMENTS

2007/0279369 A1 12/2007 Yao et al.
2016/0061588 A1* 3/2016 Cho .......................... G06F 3/00
356/614
2021/0056896 A1 2/2021 Greimel-Langauer et al.

FOREIGN PATENT DOCUMENTS

EP 2 996 250 A1 3/2016

* cited by examiner

*Primary Examiner* — David P Porta
*Assistant Examiner* — Meenakshi S Sahu
(74) *Attorney, Agent, or Firm* — Volpe Koenig (57) ABSTRACT

Devices, methods, and systems for detecting proximity. A first light emitter emits light for a first time period while a light detector is not sensing. A second light emitter emits light for a second time period while the light detector is sensing. In some implementations, the first light emitter directly illuminates the light detector during the first time period, whereas the second light emitter is obstructed from directly illuminating the light detector during the second time period. In some implementations, the first light emitter is obstructed from illuminating a display during the first time period, and the second light emitter is obstructed from directly illuminating the light detector during the second time period. In some implementations, the first light emitter emits the light during the first time period such that the light detector maintains a linear responsivity during the second time period.

20 Claims, 12 Drawing Sheets

PROXIMITY SENSOR

BACKGROUND

Accurate detection of the proximity of objects to a device has a wide variety of uses. A variety of effects can cause misdetection of object proximity.

BRIEF DESCRIPTION OF THE DRAWINGS

A more detailed understanding can be had from the following description, given by way of example in conjunction with the accompanying drawings wherein.

DETAILED DESCRIPTION

Proximity sensors based on detection of infrared (IR) light reflected off of nearby objects may be affected by environmental conditions, such as ambient light conditions.

Some implementations provide a proximity detector. The proximity detector includes a first light emitter, a second light emitter, and a light detector. The first light emitter is configured to emit light for a first time period while the light detector is not sensing. the second light emitter is configured to emit light during a second time period while the light detector is sensing.

In some implementations, the proximity sensor includes a housing which allows direct illumination of the light detector by the first light emitter, and which obstructs direct illumination of the light detector by the second light emitter. In some implementations, the proximity sensor includes a housing which obstructs illumination of a display by the first light emitter, and which obstructs direct illumination of the light detector by the second light emitter. In some implementations, the first light emitter is configured to emit light during the first time period such that the light detector maintains a linear responsivity during the second time period. In some implementations, the light detector comprises a photodiode or phototransistor. In some implementations, the first light emitter and the second light emitter comprise light emitting diodes. In some implementations, the light comprises infrared light.

Some implementations provide a method for detecting proximity. The method includes a first light emitter emitting light for a first time period while a light detector is not sensing. The method also includes a second light emitter emitting light for a second time period while the light detector is sensing.

In some implementations, the method includes the first light emitter directly illuminating the light detector during the first time period, whereas the second light emitter is obstructed from directly illuminating the light detector during the second time period. In some implementations, the first light emitter is obstructed from illuminating a display during the first time period, and the second light emitter is obstructed from directly illuminating the light detector during the second time period. In some implementations, the first light emitter emits the light during the first time period such that the light detector maintains a linear responsivity during the second time period. In some implementations, the light detector comprises a photodiode or phototransistor. In some implementations, the first light emitter and the second light emitter comprise light emitting diodes. In some implementations, the light comprises infrared light.

Some implementations provide means for sensing proximity. The means for sensing proximity include a first light emitting means for emitting a first light, a second light emitting means for emitting a second light, and a light detecting means for detecting light. The first light emitting means are configured to emit light for a first time period while the light detecting means is not sensing. The second light emitting means are configured to emit light during a second time period while the light detecting means is sensing.

In some implementations, the means for sensing proximity includes a light obstruction means which allows direct illumination of the light detecting means by the first light emitting means, and which obstructs direct illumination of the light detecting means by the second light emitting means. In some implementations, the means for sensing proximity includes a light obstruction means which obstructs illumination of a display by the first light emitting means, and which obstructs direct illumination of the light detecting means by the second light emitting means. In some implementations, the first light emitting means is configured to emit light during the first time period such that the light detecting means maintains a linear responsivity during the second time period. In some implementations, the light detecting means comprises a photodiode or phototransistor. In some implementations, the first light emitting means and the second light emitting means include light emitting diodes.

Figure 1:
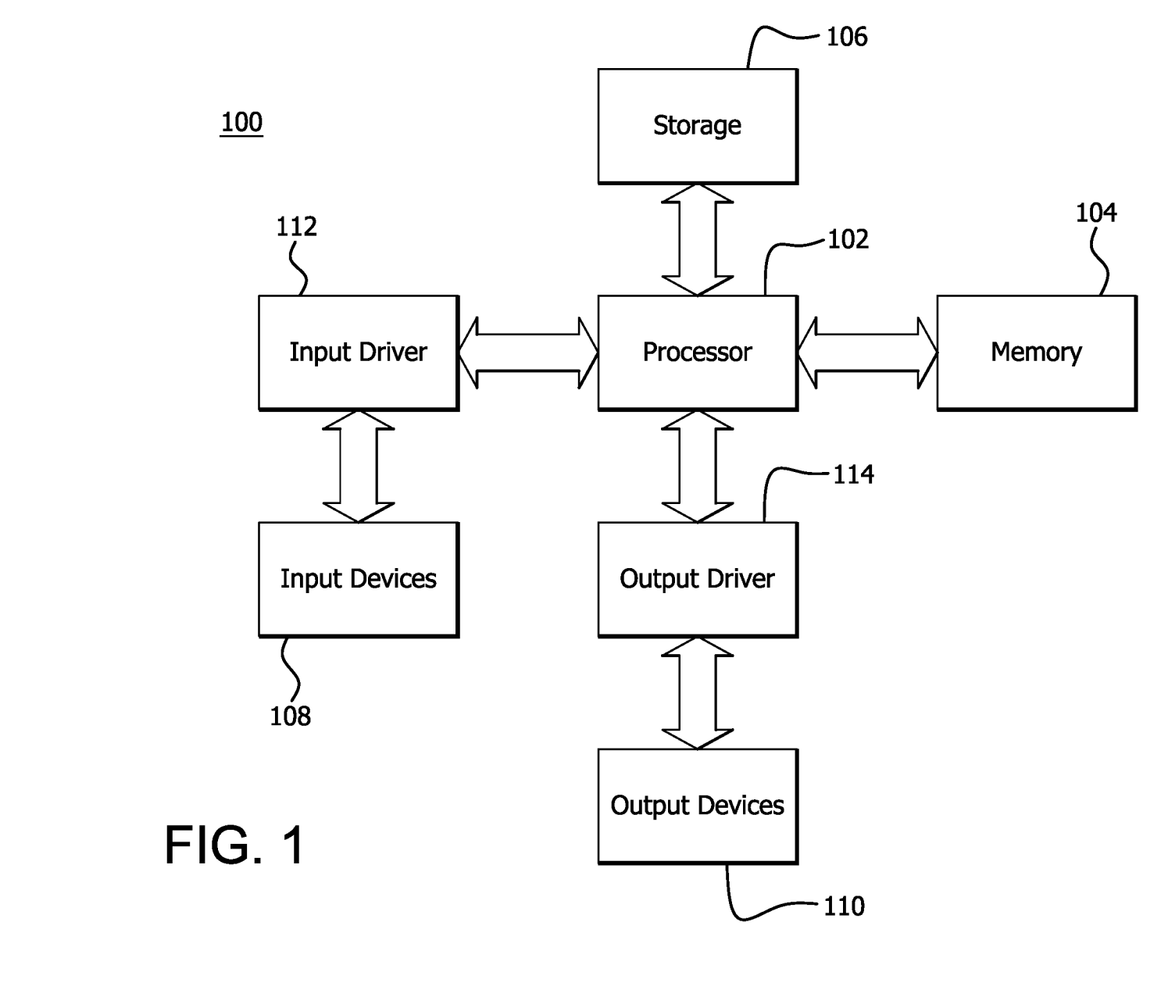
FIG. 1 is a block diagram of an example device in which one or more features of the disclosure can be implemented.

FIG. 1 is a block diagram of an example device 100 in which one or more features of the disclosure can be implemented. The device 100 can include, for example, a mobile phone (such as a smart phone), a computer, a gaming device, a handheld device, a set-top box, a television, server, a tablet computer or other types of computing devices. The device 100 includes a processor 102, a memory 104, a storage 106, one or more input devices 108, and one or more output devices 110. The device 100 can also optionally include an input driver 112 and an output driver 114. It is understood that the device 100 can include additional components not shown in FIG. 1.

In various alternatives, the processor 102 includes a central processing unit (CPU), a graphics processing unit (GPU), a CPU and GPU located on the same die, or one or more processor cores, wherein each processor core can be a CPU or a GPU. In various alternatives, the memory 104 is located on the same die as the processor 102, or is located separately from the processor 102. The memory 104 includes a volatile or non-volatile memory, for example, random access memory (RAM), dynamic RAM, or a cache.

The storage 106 includes a fixed or removable storage, for example, a hard disk drive, a solid-state drive, an optical disk, or a flash drive. The input devices 108 include, without limitation, a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 include, without limitation, a display, a speaker, a printer, a haptic feedback device, one or more lights, an antenna, or a network connection (e.g., a wireless local area network card for transmission and/or reception of wireless IEEE 802 signals).

The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. It is noted that the input driver 112 and the output driver 114 are optional components, and that the device 100 will operate in the same manner if the input driver 112 and the output driver 114 are not present.

Figure 2:
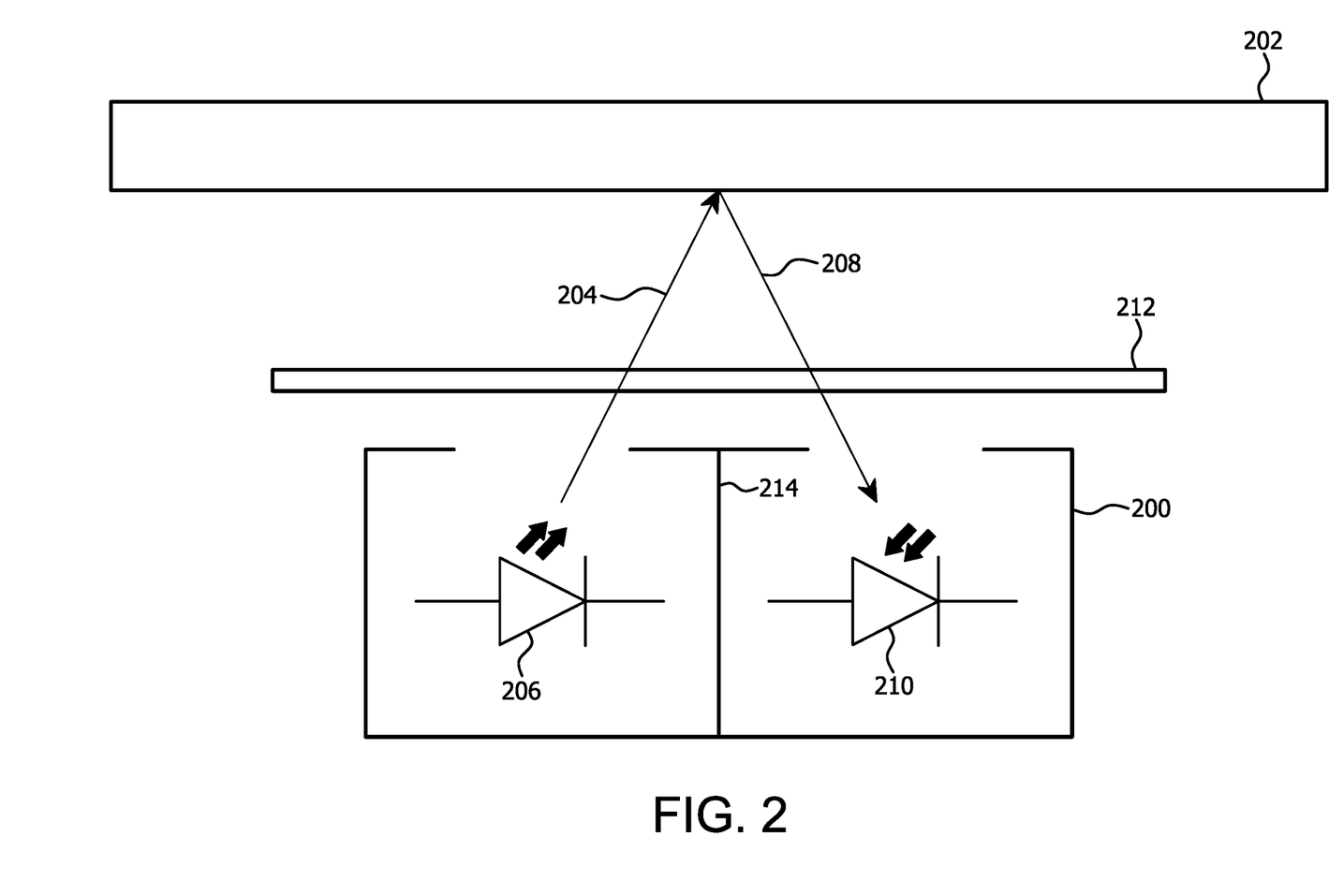
FIG. 2 is a cross-sectional view of an example proximity sensor.

FIG. 2 is a cross-sectional view of an example proximity detector 200. Proximity detector 200 is configured to detect the proximity of an object, such as object 202. In some implementations, proximity detector 200 is an input device 108 of device 100 as shown and described with respect to FIG. 1.

In this example, proximity detector 200 is an infrared proximity detector which emits infrared (IR) light 204 from IR light emitting diode (LED) 206 and receives reflected IR light 208, (e.g., reflected from object 202) by IR photodiode 210. It is noted that while proximity detector 200 operates based on the emission and detection of IR light, other proximity detectors operate based on emission and detection of other electromagnetic signals, and the principles discussed herein also apply to such proximity detectors. It is noted while proximity detector 200 emits IR light from an IR LED 206, any suitable source of IR light may be used. It is also noted while proximity detector 200 receives IR light using an IR photodiode 210, any suitable detector can be used, such as an IR phototransistor. The examples herein are described with respect to an IR LED emitter and IR photodiode detector, however it is noted that any suitable emitter and/or detector are usable in other implementations.

In the example shown in FIG. 2, IR light 204 and reflected light 208 pass through a display screen 212. Display screen 212 is an example use case for proximity detector 202 (e.g., under the display of a smartphone) and may be omitted. In some implementations, display screen 212 is an output device 110 of device 100 as shown and described with respect to FIG. 1. Display screen 212 is substantially transparent to the particular wavelength of IR light emitted and detected by proximity detector 200 (e.g., 940 nanometers), and object 202 is at least partially reflective of this wavelength of IR light. Object 202 may be the face of a user holding a smartphone (which includes proximity detector 200) to their ear for a call, for example.

Proximity detector 200 emits IR light from IR LED 206 and receives reflected IR light by IR photodiode 210. The reflected IR light generates electrical current by the IR photodiode 210. If the IR photodiode 210 current is larger than a certain threshold sensing current or voltage, proximity detector 200 is considered to be within a threshold distance of an object (e.g., object 202). In some implementations, the determination is made by processing the output of the photodetector 210 by a processing device, such as processor 102, shown and described with respect to FIG. 1. In some implementations, the photodiode current output of IR photodiode 210 is an analog signal, which is converted to a digital value by an analog-to-digital converter (ADC) and the digital value is compared with a threshold (following further processing in some implementations) to determine proximity.

In some implementations, the IR LED 206 and IR photodiode 210 transmit and receive IR light simultaneously, or during overlapping time periods. Under such conditions, IR photodiode 210 would detect both reflected and directly transmitted IR light from IR LED 206, absent some intervention. Accordingly, in some implementations, a barrier 214 is positioned between IR LED 206 and IR photodiode 210 to prevent or reduce direct transmission of IR light from IR LED 206 to IR photodiode 210. In some implementations, barrier 214 is part of a device package or housing of proximity detector 200, and is substantially opaque to the wavelength of IR light emitted by IR LED 206. The packaging or housing of proximity detector 200 includes suitable openings to allow IR light to be emitted by IR LED 206 toward potential target objects, such as object 202, and to allow reflected IR light 208 to be received by IR photodiode 210.

In example proximity detector 200, only a single IR LED 206, and a single IR photodiode 210 are shown, however, in some implementations, multiple IR LEDs and/or IR photodiodes are usable. For example, multiple IR LEDs and/or multiple IR photodiodes may be grouped together in same housing, or may be installed in separate housings.

Figure 3:
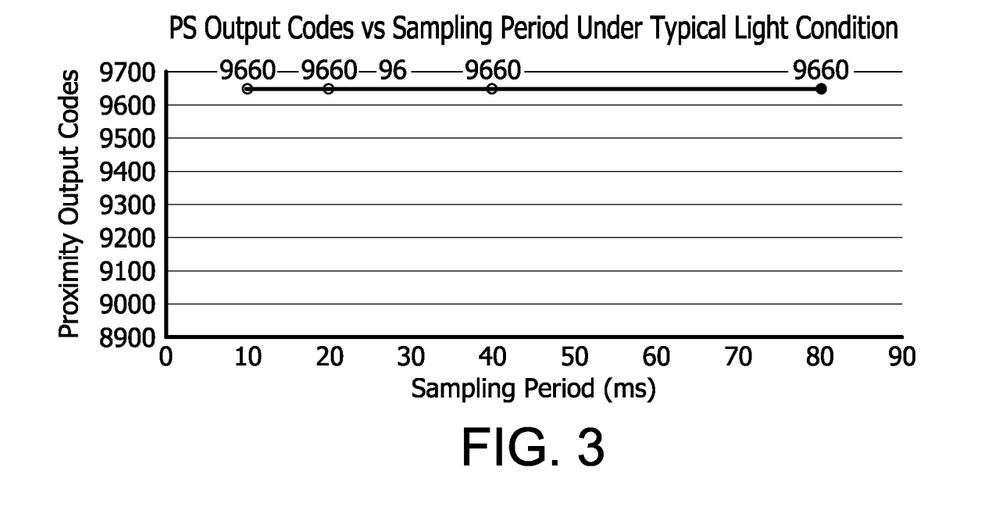
FIG. 3 is a line graph illustrating example output of the proximity sensor of FIG. 2 under conditions of typical lighting.

FIG. 3 is a line graph 300 illustrating example digital output value over time of photodiode 210. The conditions prevailing during the example sampling period illustrated with respect to FIG. 3 include ambient light. For the purposes of this example, the ambient light is considered to be light ambient in a typical brightly lit room, or outdoors during daytime. Line graph 300 shows that the digital output code from the photodiode has a value of 9660 after 10, 20, 40, and 80 milliseconds of reception. The output codes shown in the graph either include the ambient IR light in the photodetector sensitivity range, or represent the received IR light after ambient IR light has been subtracted, depending on the desired implementation.

In either case, FIG. 3 illustrates that for several example points over the sampling period, the photodetector output code remains constant (or substantially constant). This is consistent with the conditions prevailing in the example of FIG. 2, where all of the components are stationary, object 202 is close enough to proximity sensor 200 for reflected IR light 208 to reach photodiode 210, and where ambient light is such that photodiode 210 is able to operate normally (e.g., under equilibrium conditions).

Typical photodiodes detect incoming light through the interaction of the inbound photons with charge carrier generation and recombination processes within the photodiode. Detection of inbound photons thus relies on a suitable number of charge carrier generation and recombination being present within the photodiode. Proximity detectors (such as proximity detector 200) are typically designed to accurately detect inbound light within their responsivity range when the photodiode current generation is in a carrier generation equilibrium condition, and are typically designed such that the photodiode is in the equilibrium condition during typical photon sensing operating conditions.

Ordinarily, such typical photon sensing operating conditions include ambient light, which increases the number of charge carrier generation within the photodiode. In conditions where ambient light is absent or significantly reduced (e.g., a dark room), except the dark current due to thermal generation of electron and hole pairs inside the photodiode junction, there is no additional charge carriers generated inside the photodiode junction due to ambient light. The carrier generation and recombination process may prevent a photodiode which is configured to reach an equilibrium condition under typical ambient light from operating in the equilibrium condition in the absence of ambient light. In some such circumstances, the effective photo current generation or the responsivity of the IR photodiode 210 is reduced resulting is a less charge carrier generation inside the photodiode to detect all of the reflected IR light, and the reduce of charge carriers will cause photodiode responsivity decay over time due to changing of carrier generation and recombination processes of the photodiode under dark condition. In some cases, the charge carrier decay within the photodiode will cause the proximity detector to output incorrect information.

Figure 4:
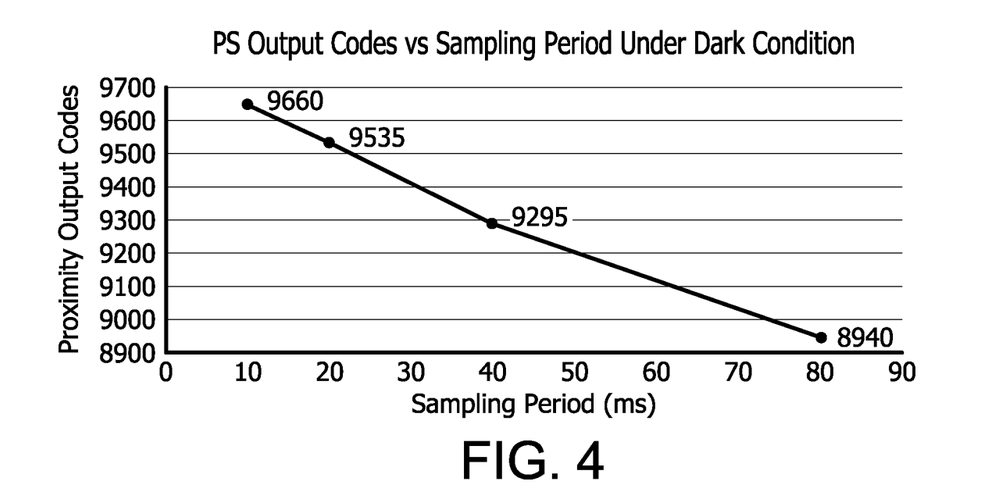
FIG. 4 is a line graph illustrating example output of the proximity sensor of FIG. 2 under conditions of dark lighting.

FIG. 4 is a line graph 400 illustrating example output over time of photodiode 210. The conditions prevailing during the example sampling period illustrated with respect to FIG. 4 do not include ambient light (e.g., as in a dark room). Line graph 400 shows that the output code from the photodiode has a value of 9660 after 10 milliseconds of reception, but that the value decays or "droops" to 9535 after 20 milliseconds of reception, to 9295 after 40 milliseconds of reception, and to 8940 after 80 milliseconds of reception.

FIG. 4 illustrates that the photodetector output code is decreasing over the sampling period. This is consistent with the conditions prevailing in the example of FIG. 2, where all of the components are stationary, object 202 is close enough to proximity sensor 200 for reflected IR light 208 to reach photodiode 210, but where ambient light is absent, such that photodiode 210 is not able to maintain a linear responsivity due to carrier generation and recombination processes that are not under an equilibrium condition, and the otherwise steady incoming reflected IR light 208 is not fully detected by photodiode 210 due to decaying charge carriers.

Figure 5:
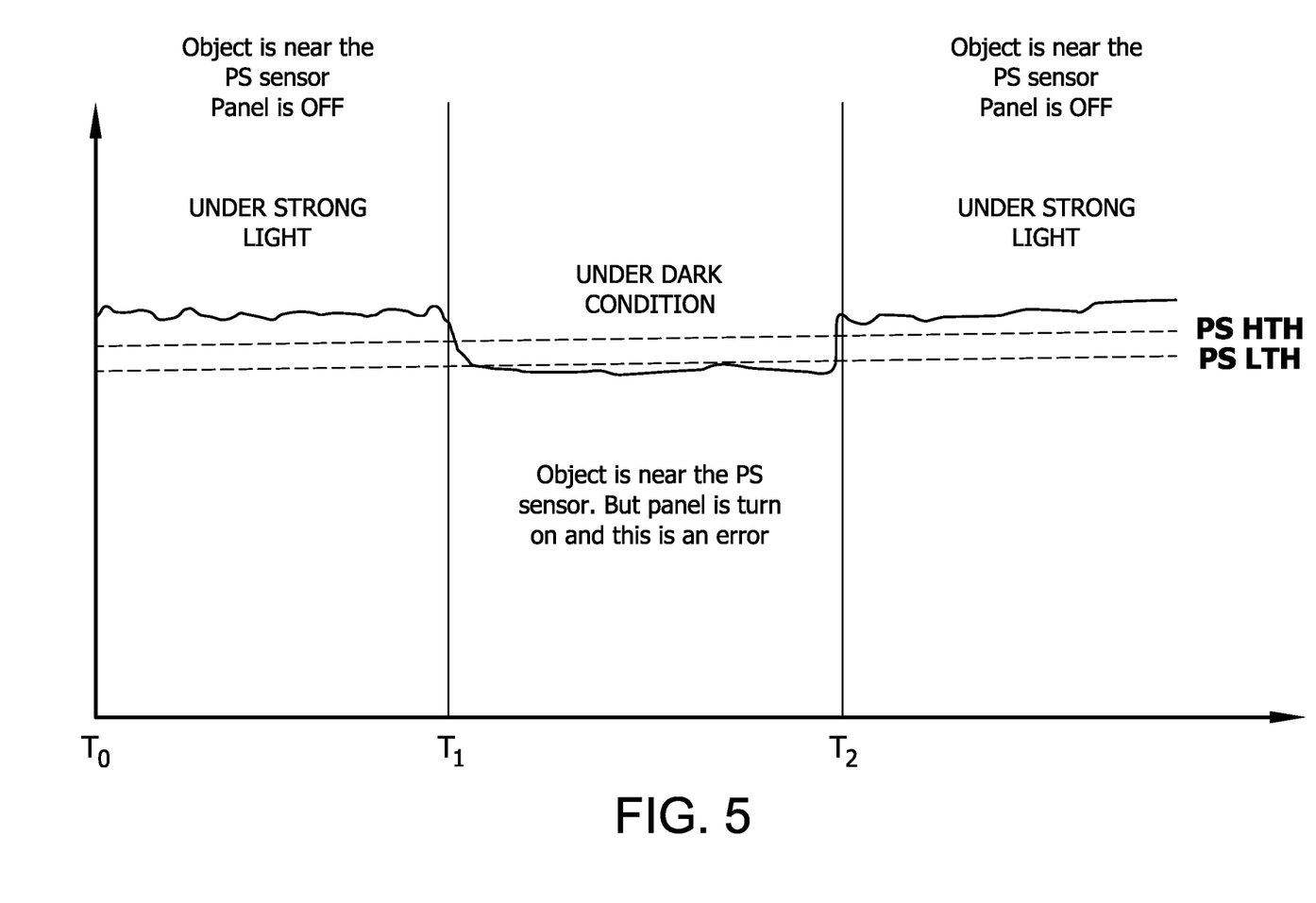
FIG. 5 is a line graph illustrating example output of the proximity sensor of FIG. 2 during both light and dark conditions.

FIG. 5 is a line graph 500 illustrating example output over time of photodiode 210, as shown in FIG. 2, under alternating conditions of ambient light and darkness. From T0 to T1, proximity sensor 200 is exposed to typical ambient light, and photodiode 210 outputs values above a threshold (PS HTH) for detection of a proximate object (e.g., indicating the presence of object 202). From T1 to T2, ambient light is no longer present, and photodiode 210 begins to experience charge carrier decay. Under these conditions, photodiode 210 outputs values below a threshold (PS LTH) for detection of a proximate object (e.g., failing to indicating the presence of object 202). After T2, proximity sensor 200 is once again exposed to typical ambient light, and photodiode 210 outputs values above a threshold for detection of a proximate object (e.g., indicating the presence of object 202).

It is clear from line graph 500 that changing ambient light conditions may cause proximity detector 200 to fail to detect a proximate object (e.g., object 202). Incorrect operation of the proximity detector can have negative effects ranging from unnecessary energy consumption and user annoyance when a smartphone screen incorrectly turns on in a darkened room, to more serious effects in other applications; e.g., where the proximity sensor is used in manufacturing or security applications.

One possible way to increase the number of charge carriers in photodiode 210 under dark conditions would be to illuminate photodiode 210 using IR LED 206 prior to sensing (either ambient light sensing, or combined ambient and IR reflection sensing). Because barrier 214 prevents direct illumination of photodiode 210 by IR LED 206 however, a high intensity and/or long duration of illumination would be required to generate a suitable number of charge carriers, and may not even be possible, depending on the partial reflectivity of display screen 212 or other components suitably disposed with respect to proximity detector 200. Such high intensity and/or long duration of illumination may have the adverse effect of consuming a large amount of power, and may create or exacerbate visual artifacts on display screen 212. For example, if display screen 212 is an organic LED (OLED) display, thin-film transistors (TFT) of display screen 212 may be activated by high intensity and/or long duration IR pulses, causing pixels driven by the TFT transistors to display a "dark spot" visual artifact to the user.

Figure 6:
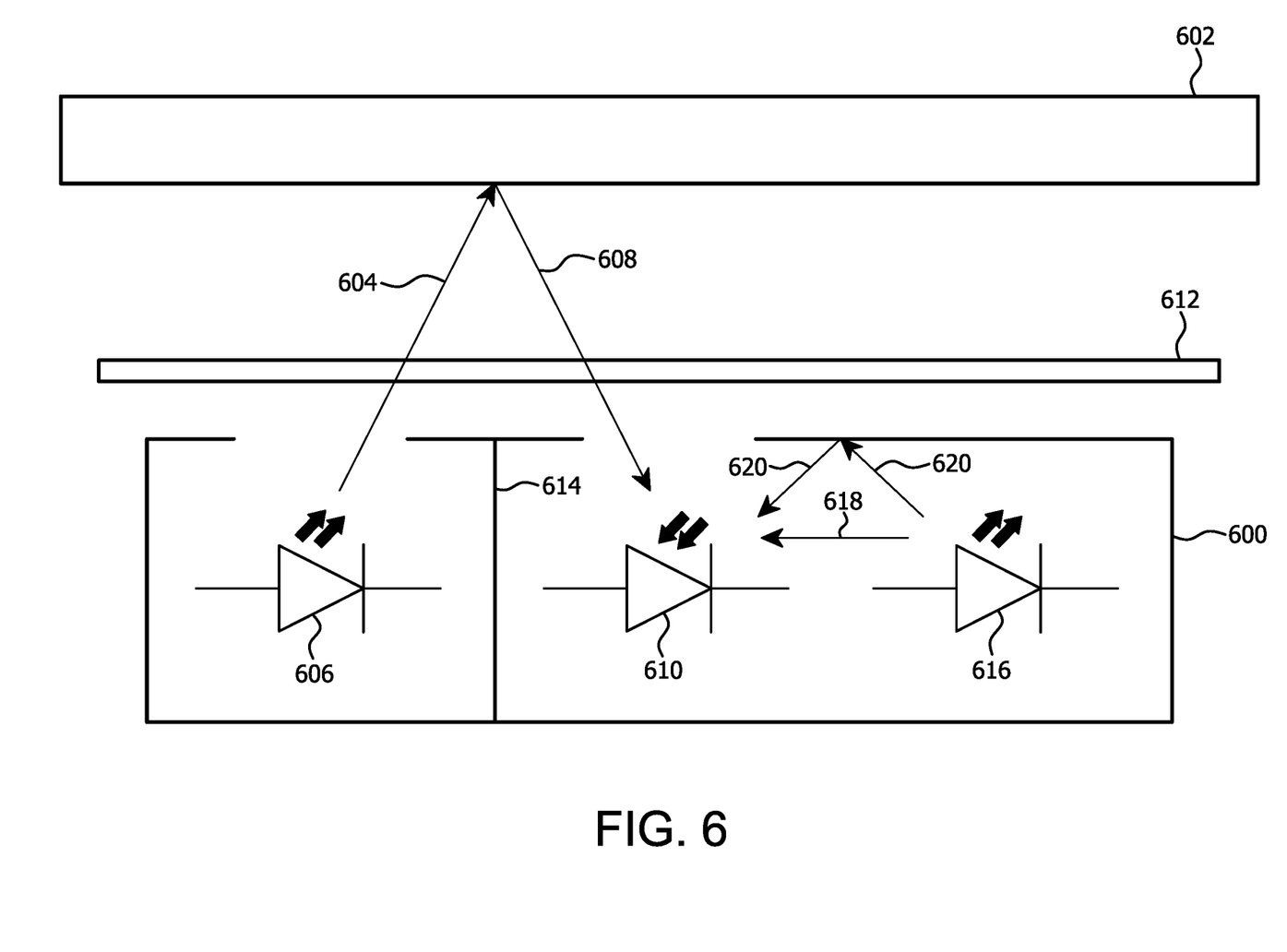
FIG. 6 is a cross-sectional view of an example proximity sensor which includes a boost emitter.

FIG. 6 is a cross-sectional view of an example proximity detector 600. Proximity detector 600 is configured to detect the proximity of an object, such as object 602. In some implementations, proximity detector 600 is an input device 108 of device 100 as shown and described with respect to FIG. 1.

In this example, proximity detector 600 is an infrared proximity detector which emits infrared (IR) light 604 from IR light emitting diode 606 and receives reflected IR light 608, (e.g., reflected from object 602) by IR photodiode 610. It is noted that while proximity detector 600 operates based on the emission and detection of IR light, other proximity detectors operate based on emission and detection of other electromagnetic signals, and the principles discussed herein also apply to such proximity detectors. It is noted while proximity detector 600 emits IR light from an IR LED 606, any suitable source of IR light may be used. It is also noted while proximity detector 600 receives IR light using an IR photodiode 610, any suitable detector can be used, such as an IR phototransistor.

In the example shown in FIG. 6, IR light 604 and reflected light 608 pass through a display screen 612. Display screen 612 is an example use case for proximity detector 602 (e.g., under the display of a smartphone) and may be omitted in other implementations. In some implementations, display screen 612 is an output device 110 of device 100 as shown and described with respect to FIG. 1. Display screen 612 is substantially transparent to the particular wavelength of IR light emitted and detected by proximity detector 600 (e.g., 940 nanometers), and object 602 is at least partially reflective of this wavelength of IR light. Object 602 may be the face of a user holding a smartphone (which includes proximity detector 600) to their ear for a call, for example.

Proximity detector 600 emits IR light from IR LED 606 and receives reflected IR light by IR photodiode 610. In some implementations, the IR photodiode 610 is integrated with or in communication with a CMOS analog front-end amplifier circuit. In some implementations, the photodiode current generated by the reflected light 608 is converted into digital data using an ADC circuit (e.g. such as a successive approximation register (SAR) analog-to-digital converter).

If the proximity detector 600 digital output data is larger than the programmable distance threshold digital value, the proximity detector 600 is considered to be within a threshold distance of an object (such as object 602). In some implementations, the determination is made by processing the output of the photodetector 610 by a processing device, such as processor 102, shown and described with respect to FIG. 1. In some implementations, the output of IR photodiode 610 is an analog voltage signal, which is converted to a digital value by an external analog-to-digital converter (ADC) and the digital value is compared with a threshold (following further processing in some implementations) to determine proximity.

In some implementations, the IR LED 606 and IR photodiode 610 transmit and receive IR light simultaneously, or during overlapping time periods. Under such conditions, IR photodiode 610 would detect both reflected and directly transmitted IR light from IR LED 606, absent some intervention. Accordingly, in some implementations, a barrier 614 is positioned between IR LED 606 and IR photodiode 610 to prevent or reduce direct transmission of IR light from IR LED 606 to IR photodiode 610. In some implementations, barrier 614 is part of a device package or housing of proximity detector 600, and is substantially opaque to the wavelength of IR light emitted by IR LED 606. The packaging or housing of proximity detector 600 includes suitable openings (e.g., as shown) to allow IR light to be emitted by IR LED 606 toward potential target objects, such as object 602, and to allow reflected IR light 608 to be received by IR photodiode 610.

In order to maintain a linear photodiode 610 responsivity in an equilibrium carrier generation and recombination condition under dark conditions, proximity detector 600 includes a second IR LED 616. IR LED 616 is disposed within the device package or housing of proximity detector 600 such that IR light 618 from IR LED 616 directly illuminates photodiode 610 and/or reflected IR light 620, from IR LED 616, reflected from the interior of the device package or housing of proximity detector 600 or otherwise, illuminates photodiode 610. IR LED 616 (or other types of emitters used to increase charge carriers in a photodiode or other detector) can be referred to as a boost emitter.

Before the pulsing of the IR emitter 606 for proximity sensing, the IR light emitted from IR LED 616 injects photons into the IR photodiode 610 generating additional charge carriers within photodiode 610 to counterbalance the responsivity decay of the photodiode 610. In order to prevent or reduce undesirable visual effects of IR light emitted from IR LED 616 (e.g., generation of visual artifacts on display screen 612 (e.g., active matrix organic LED (AMOLED) display effects), and/or interference with measurement of reflected IR light 608 by photodiode 610), IR LED 616 may be positioned within the package or housing of proximity sensor 600 to avoid or reduce direct and/or reflected IR light emitted from IR LED 616 from leaving the device package or housing.

In example proximity detector 600, only a single IR LED 606, a single IR LED 616, and a single IR photodiode 610 are shown, however, in some implementations, multiple IR LEDs and/or IR photodiodes are usable. For example, multiple IR LEDs 606, multiple IR LEDs 616, and/or multiple IR photodiodes 610 may be grouped together in same housing, or may be installed in separate housings, as appropriate.

Figure 7:
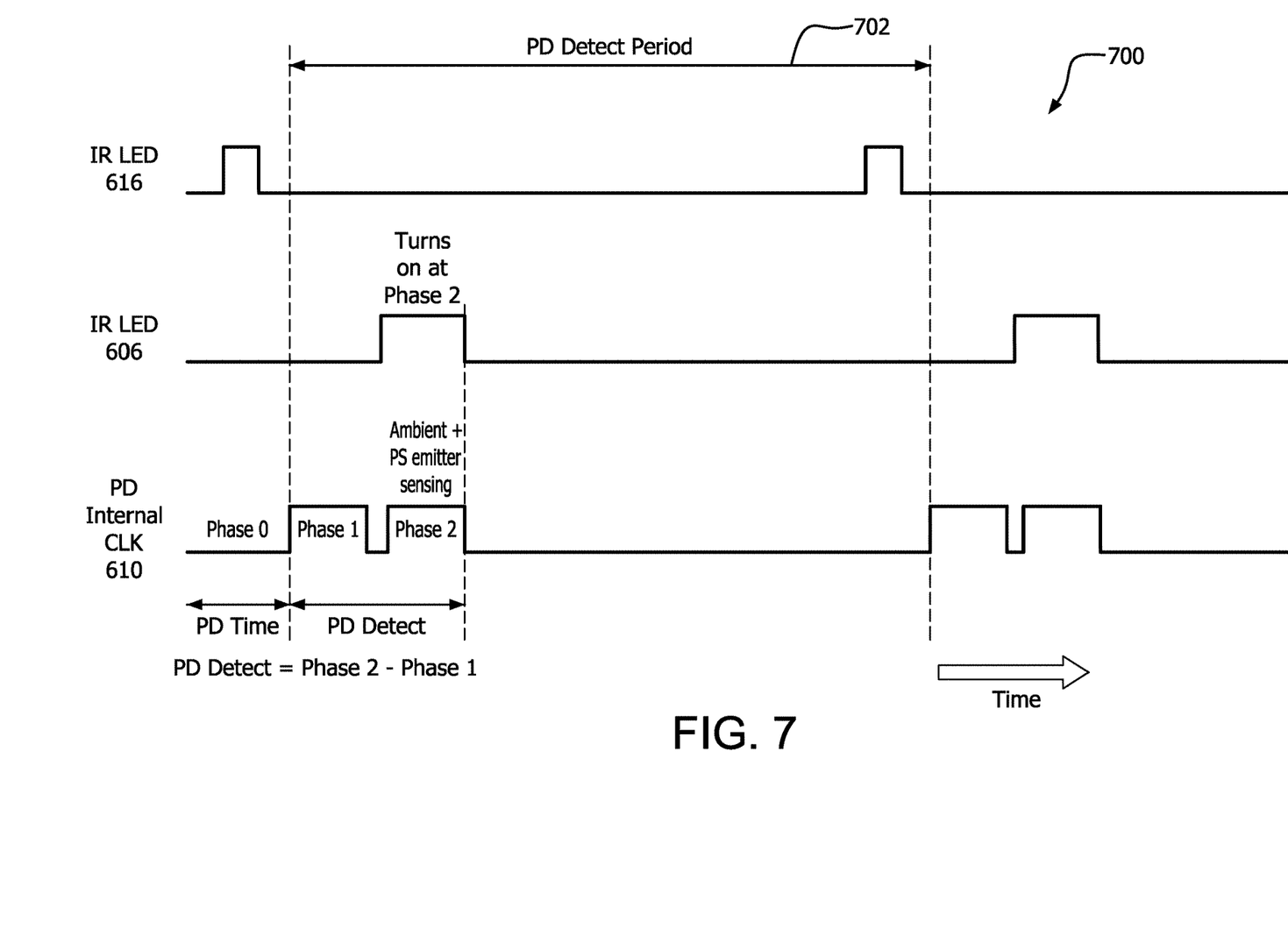
FIG. 7 is a signal diagram illustrating example operation of the photodiode and IR light emitting diodes (LEDs) of FIG. 6.

FIG. 7 is a signal diagram 700 illustrating example operation of the photodiode and IR LEDs of FIG. 6. The example operation includes "priming" of the photodiode 610 (i.e., generation of charge carriers) by IR illumination from IR LED 616, and detection of ambient light and reflected IR light from IR LED 606.

In phase 0, IR LED 616 illuminates photodiode 610 as shown in signal diagram 700. During phase 0, photodiode 610 is not used to measure IR light, but rather, absorbs IR light from IR LED 616 in order to generate charge carriers. IR LED 616 is turned on (e.g., pulsed) for a duration sufficient to generate desired amount of charge carriers in photodiode 610, and is turned off a sufficient time before detection by photodiode 610 for the photodiode to settle into linear responsivity state.

In phase 1, photodiode 610 measures the ambient light in the environment of proximity sensor 600 (IR LED 606 is off during phase 1). In phase 2, IR LED 606 illuminates the environment of proximity sensor 600 and photodiode 610 measures the combination of ambient light in the environment of proximity sensor 600 and reflected IR illumination from IR LED 606, including reflected IR light 608 from object 602 in this example. The measurement of reflected IR illumination from IR LED 606, including reflected IR light 608 from object 602, is determined by subtracting the measured ambient IR light from phase 1 from the total measured IR light from phase 2.

By "priming" photodiode 610 in phase 0, the "drooping" effect on the measurements during phase 1 and phase 2 under dark conditions is avoided or reduced. This can have the advantage of increasing the accuracy of proximity sensor 600 under dark conditions.

In some implementations, the priming and detection phases do not cycle continuously, but rather, repeat after a delay. This can have the advantage of saving power and/or avoiding visual artifacts on display screen 612 in some circumstances, e.g., where slower proximity detection is acceptable. For example, the detection period 702 between priming and detection cycles may be extended (e.g., by a desired number of clock cycles) in some implementations.

Figure 8:
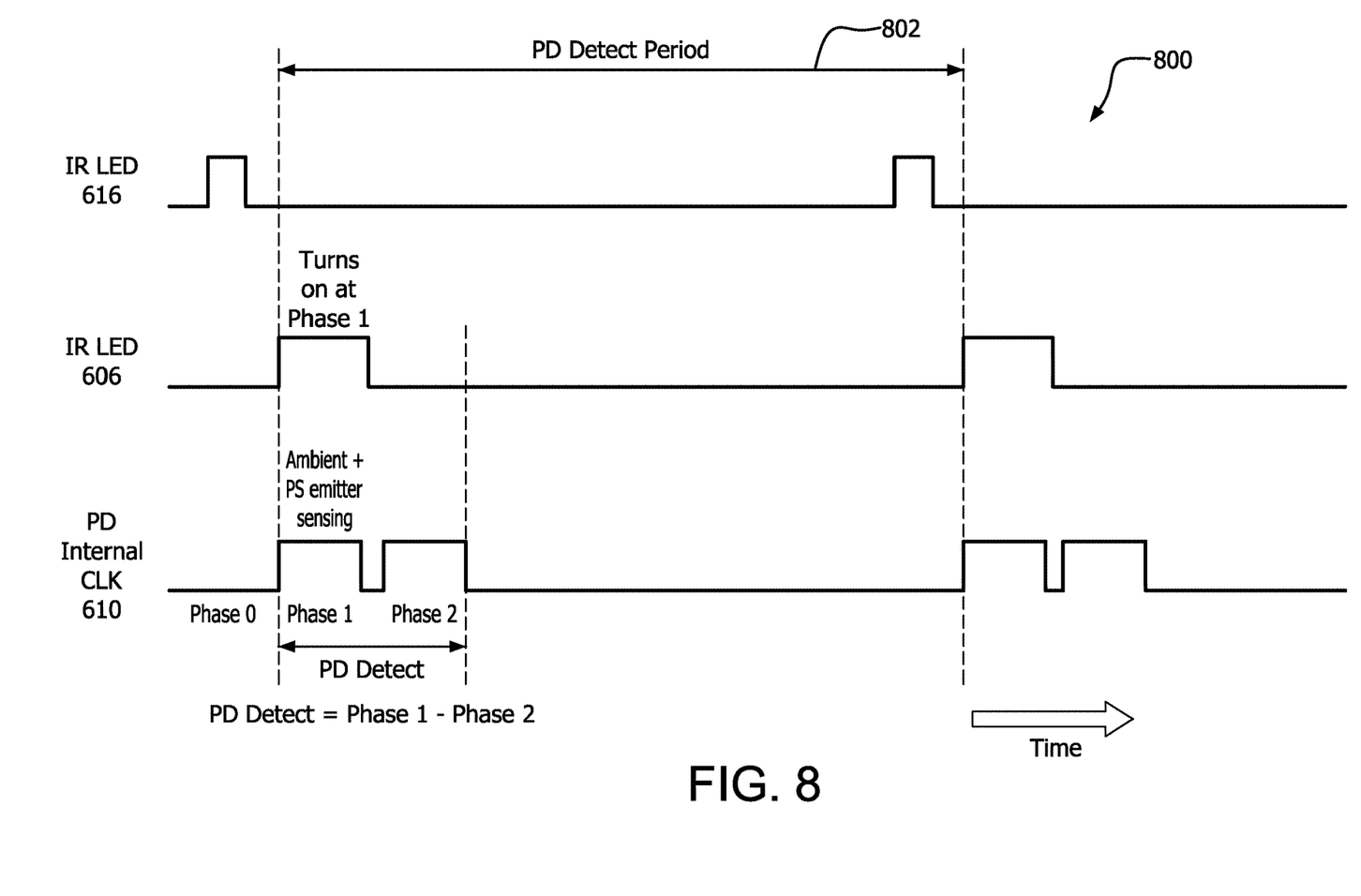
FIG. 8 is a signal diagram illustrating further example operation of the photodiode and IR LEDs of FIG. 6.

FIG. 8 is a signal diagram 800 illustrating example operation of the photodiode and IR LEDs of FIG. 6. The example operation includes "priming" of the photodiode 610 (i.e., generation of charge carriers) by IR illumination from IR LED 616, and detection of ambient light and reflected IR light from IR LED 606. The example of FIG. 8 is similar to the example of FIG. 7, except that the order of phase 1 and phase 2 is reversed.

In phase 0, IR LED 616 illuminates photodiode 610 as shown in signal diagram 800. During phase 0, photodiode 610 is not used to measure IR light, but rather, absorbs IR light from IR LED 616 in order to generate charge carriers. IR LED 616 is turned on (e.g., pulsed) for a duration sufficient to generate desired amount of charge carriers in photodiode 610, and is turned off a sufficient time before detection by photodiode 610 for the photodiode to settle into linear responsivity state.

In phase 1, IR LED 606 illuminates the environment of proximity sensor 600 and photodiode 610 measures the combination of ambient light in the environment of proximity sensor 600 and reflected IR illumination from IR LED 606, including reflected IR light 608 from object 602 in this example. In phase 2, photodiode 610 measures only the ambient light in the environment of proximity sensor 600 (IR LED 606 is off during phase 2). The measurement of reflected IR illumination from IR LED 606, including reflected IR light 608 from object 602, is determined by subtracting the measured ambient IR light from phase 2 from the total measured IR light from phase 1.

Figure 9:
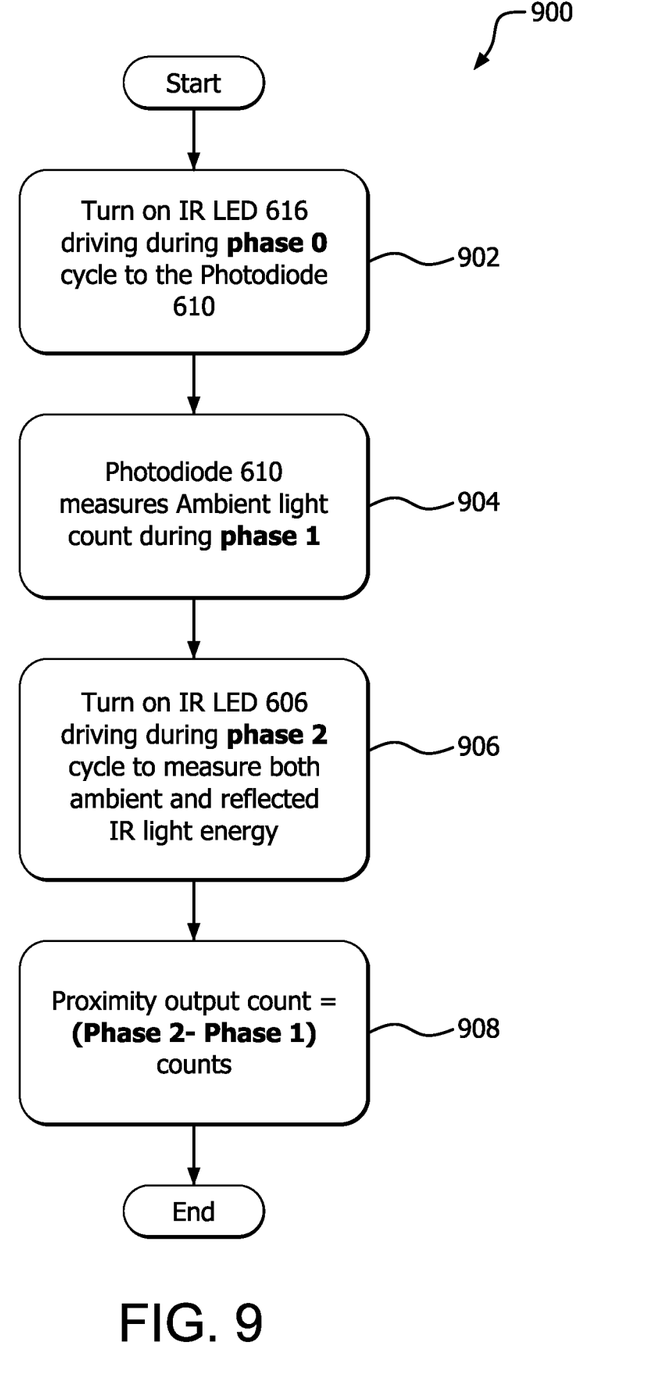
FIG. 9 is a flow chart illustrating example operation of the photodiode and IR LEDs of FIG. 6.

FIG. 9 is a flowchart illustrating a method 900 for operation of the photodiode and IR LEDs of FIG. 6. Method 900 illustrates the example operation illustrated in FIG. 7. In step 902, IR LED 616 is turned on to prime photodiode 610 during phase 0. In step 904, IR LED 616 is turned off, and photodiode 610 measures ambient light during phase 1. In step 906, IR LED 606 is turned on, and photodiode 610 measures the combination of ambient light and reflected light from IR LED 606. In step 908, the measurement of reflected IR illumination from IR LED 606, including reflected IR light 608 from object 602, is determined by subtracting the measured ambient IR light from phase 1 from the total measured IR light from phase 2.

It is noted that method 900 can be modified to illustrate the example operation of FIG. 8 by switching the operations of steps 904 and 906, and by subtracting phase 2 from phase 1 in step 908.

Under typical ambient lighting conditions, priming by IR LED 616 may not be needed. By only turning on IR LED 616 under conditions where priming is needed (e.g., dark conditions), power consumption may be reduced in some cases.

Figure 10:
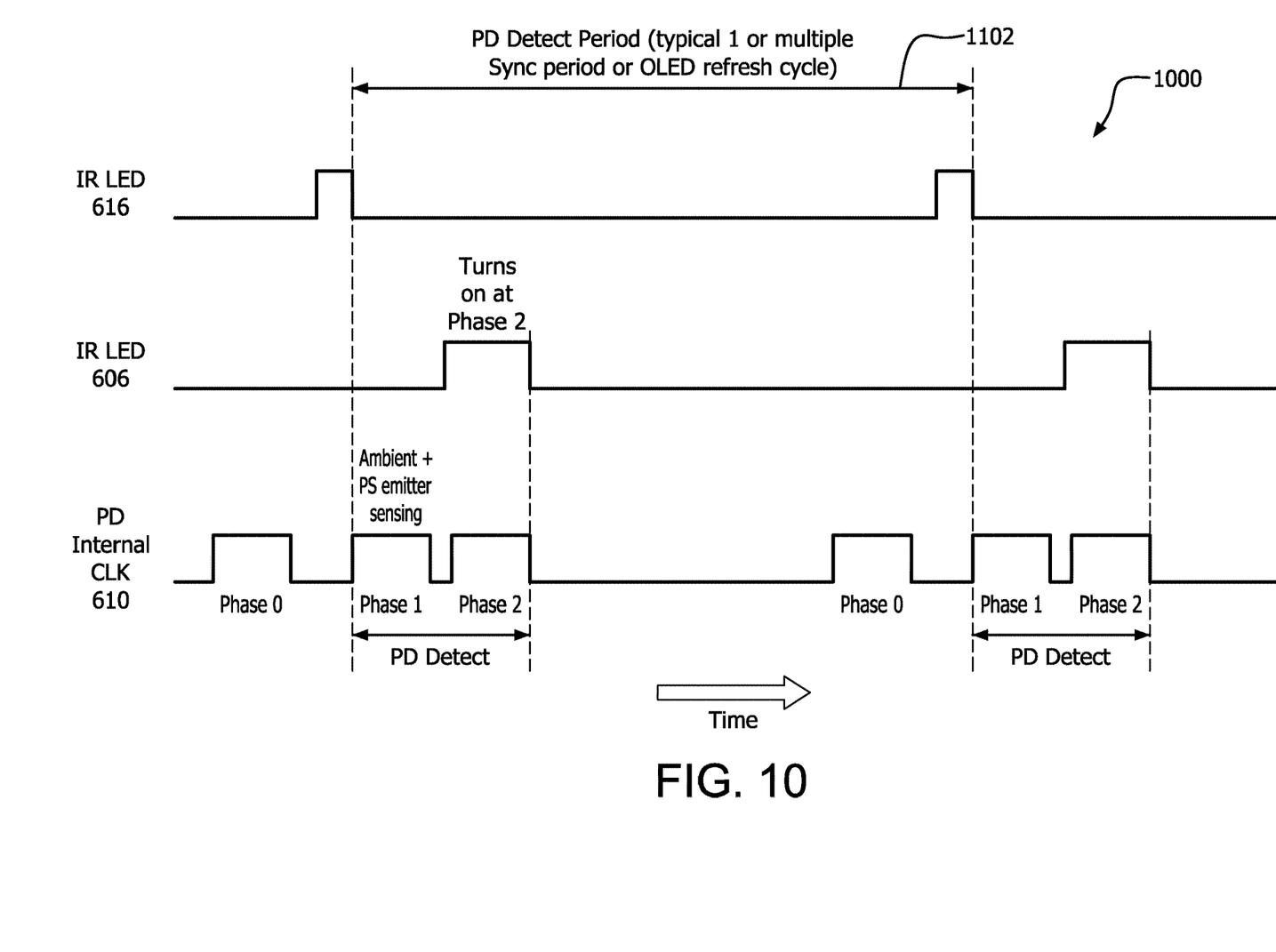
FIG. 10 is a flow chart illustrating further example operation of the photodiode and IR LEDs of FIG. 6.

FIG. 10 is a signal diagram 1000 illustrating example operation of the photodiode and IR LEDs of FIG. 6. The example operation includes phase 0 ambient light sensing, priming of the photodiode 610 (i.e., generation of charge carriers) by IR illumination from IR LED 616 (depending on the phase 0 ambient light sensing), and detection of ambient light and reflected IR light from IR LED 606.

The example of FIG. 10 is similar to the example of FIG. 7, except that a sensing period is added to phase 0 to determine whether to turn on LED 616 during phase 0 (i.e., whether to "prime" photodiode 610).

Phase 0 includes sensing and illumination. In phase 0 sensing, photodiode 610 measures ambient light while IR LED 606 and IR LED 616 are off. If the measured ambient light is below a threshold (e.g., if the ambient light is low enough that there are insufficient charge carriers in photodiode 610 to maintain a linear responsivity), IR LED 616 is turned on in phase 0 illumination to illuminate photodiode 610 as shown in signal diagram 1000. During the phase 0 illumination, photodiode 610 is not used to measure IR light, but rather, it absorbs IR light from IR LED 616 in order to generate charge carriers. IR LED 616 is turned on (e.g., pulsed) for a duration sufficient to generate desired amount of charge carriers in photodiode 610, and is turned off a sufficient time before detection by photodiode 610 for the photodiode to settle into linear responsivity state.

In phase 1, photodiode 610 measures the ambient light in the environment of proximity sensor 600 (IR LED 606 is off during phase 1). In phase 2, IR LED 606 illuminates the environment of proximity sensor 600 and photodiode 610 measures the combination of ambient light in the environment of proximity sensor 600 and reflected IR illumination from IR LED 606, including reflected IR light 608 from object 602 in this example. The measurement of reflected IR illumination from IR LED 606, including reflected IR light 608 from object 602, is determined by subtracting the measured ambient IR light from phase 1 from the total measured IR light from phase 2.

By priming photodiode 610 in phase 0 under dark conditions, the "drooping" effect on the measurements during phase 1 and phase 2 under dark conditions is avoided or reduced. This can have the advantage of increasing the accuracy of proximity sensor 600 under dark conditions. By not priming photodiode 610 in phase 0 if ambient light illumination is great enough to produce sufficient charge carriers in photodiode 610, IR LED 616 is not turned on unnecessarily. This can have the advantage of saving power in some cases.

In some implementations, the priming and detection phases do not cycle continuously, but rather, repeat after a delay. This can have the advantage of saving power and/or avoiding visual artifacts on display screen 612 in some circumstances, e.g., where slower proximity detection is acceptable. For example, the detection period 1002 between priming and detection cycles may be extended (e.g., by a desired number of clock cycles) in some implementations.

Figure 11:
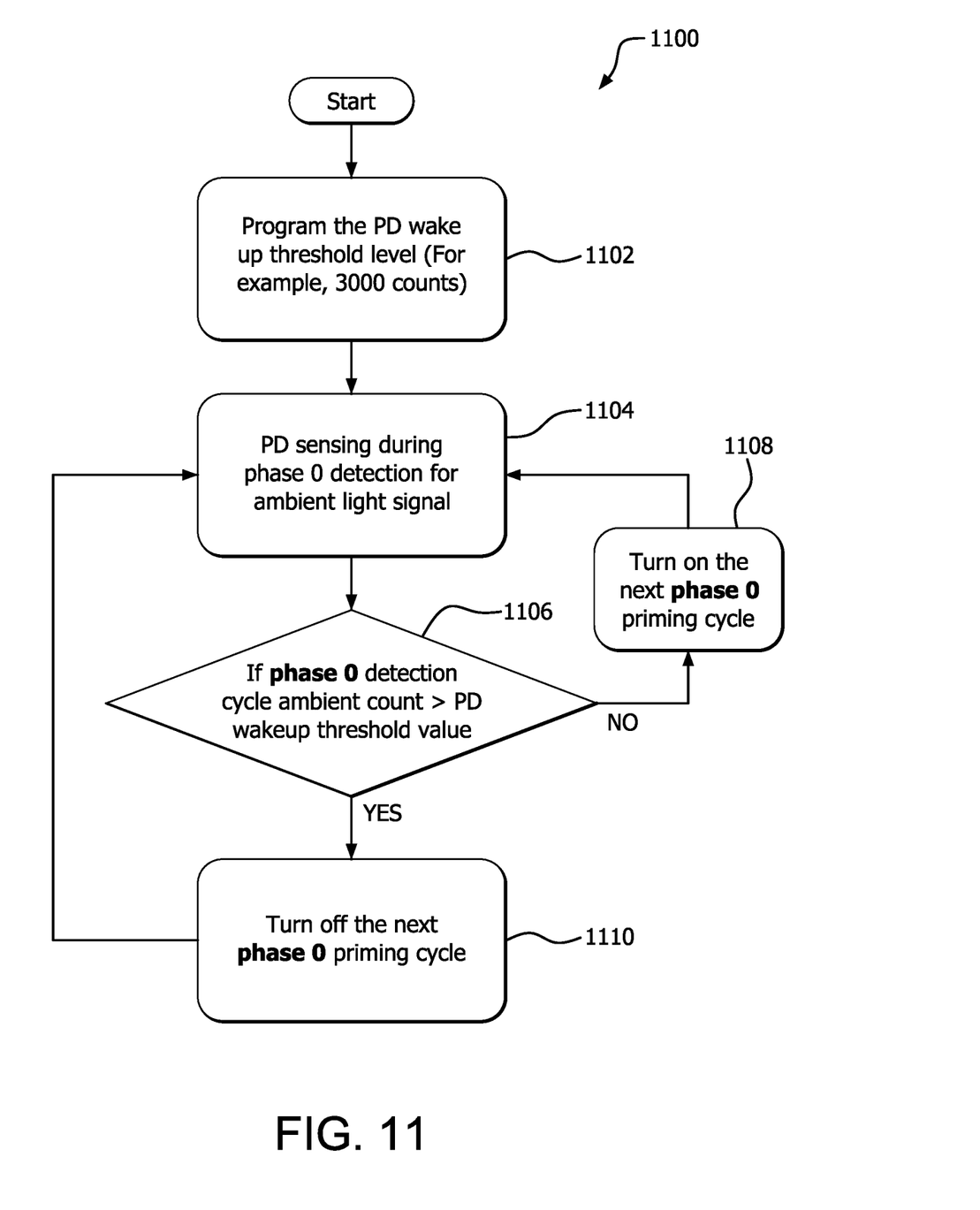
FIG. 11 is a flowchart illustrating an example method for operation of the photodiode and IR LEDs of FIG. 6.

FIG. 11 is a flowchart illustrating an example method 1100 for operation of the photodiode and IR LEDs of FIG. 6. Method 1100 illustrates the example operation of phase 0 as illustrated in FIG. 10. In step 1102, a "wakeup" threshold level is programmed for photodiode 610. In some implementations, the wakeup threshold is a threshold output of photodiode 610 below which photodiode 610 will not have enough charge carriers to accurately perform proximity detection.

In step 1104, photodiode 610 senses ambient light during phase 0 detection, as illustrated in FIG. 10. On condition 1106 that the ambient light sensed during phase 0 detection is greater than the threshold, phase 0 priming is turned off for the next phase 0 in step 1108. On condition 1106 that the ambient light sensed during phase 0 detection is not greater than the threshold, phase 0 priming is turned on for the next phase 0 in step 1110.

Turning on IR LED 616 to illuminate photodiode 610 only when needed to increase the amount of charge carriers can save power in some implementations, however adding phase 0 detection of ambient light to determine whether to turn on IR LED 616 presents added power consumption. By using ambient light detection from a previous cycle instead of adding phase 0 ambient light detection, power consumption may be reduced in some cases.

Figure 12:
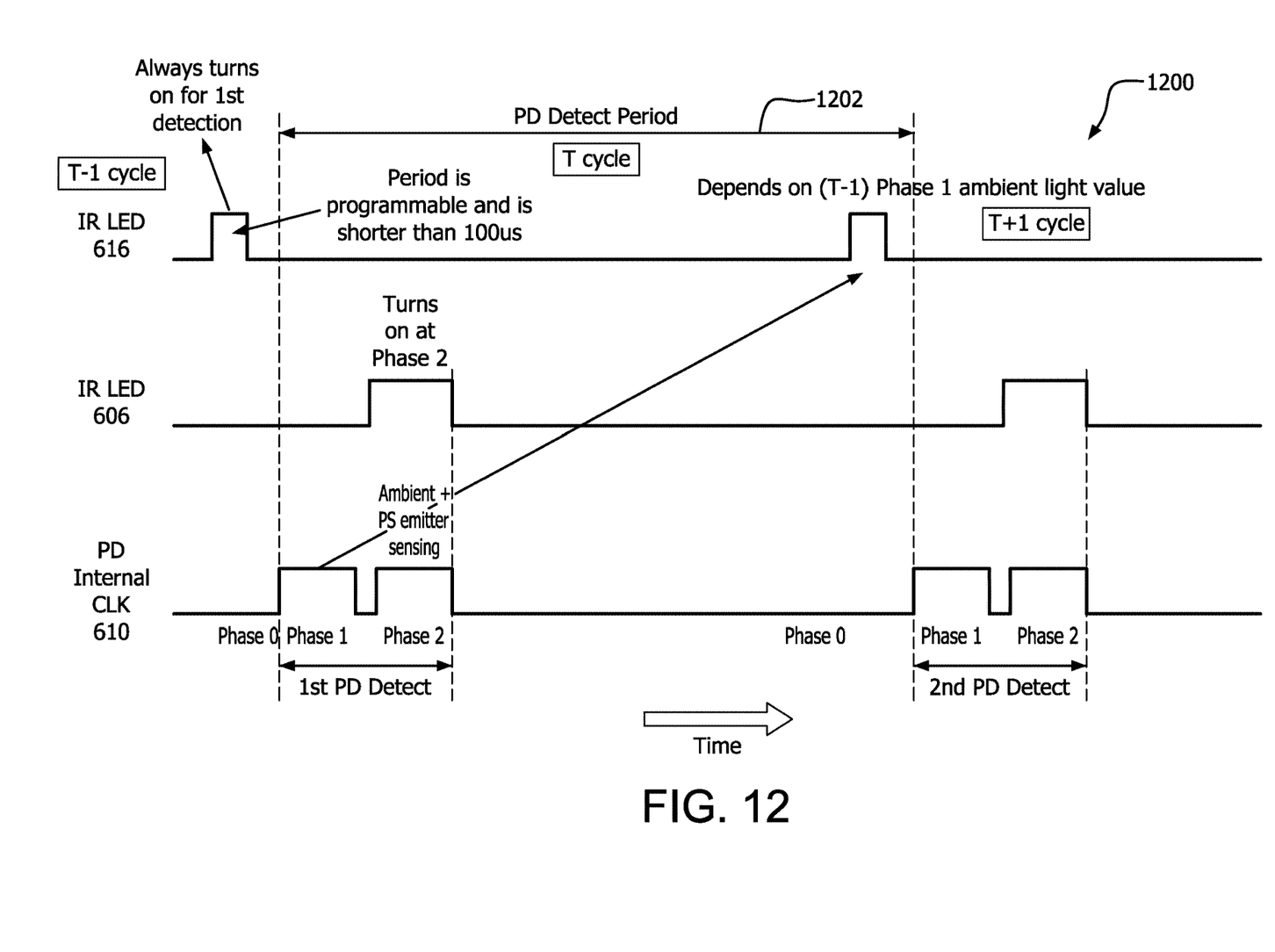
FIG. 12 is a signal diagram 1200 illustrating example operation of the photodiode and IR LEDs of FIG. 6.

FIG. 12 is a signal diagram 1200 illustrating example operation of the photodiode and IR LEDs of FIG. 6. The example operation includes phase 0 priming of the photodiode 610 (i.e., generation of charge carriers) by IR illumination from IR LED 616 (depending on the phase 0 ambient light sensing of the previous cycle), and detection of ambient light and reflected IR light from IR LED 606.

The example of FIG. 12 is similar to the example of FIG. 7, except that ambient light sensing from a previous cycle is used to determine whether to turn on LED 616 during phase 0 (i.e., whether to "prime" photodiode 610). In the case of the very first cycle of operation (e.g., after cold start or reset), the LED 616 can simply be turned on for the first cycle by default (or turned off) or handled in any other desired way.

Phase 0 includes illumination in the example of FIG. 12. During the phase 0 illumination, photodiode 610 is not used to measure IR light, but rather, it absorbs IR light from IR LED 616 in order to generate charge carriers. IR LED 616 is turned on (e.g., pulsed) for a duration sufficient to generate desired amount of charge carriers in photodiode 610, and is turned off a sufficient time before detection by photodiode 610 for the photodiode to settle into linear responsivity state.

In phase 1, photodiode 610 measures the ambient light in the environment of proximity sensor 600 (IR LED 606 is off during phase 1). If the measured ambient light is below a threshold (e.g., if the ambient light is low enough that there would be insufficient charge carriers in photodiode 610 for accurate measurements, absent priming), IR LED 616 is turned on in the subsequent phase 0 to illuminate photodiode 610 as shown in signal diagram 1200. Thus, the ambient light measurement of phase 0 during T cycle as shown in signal diagram 1200 is used to determine whether to turn on IR LED 616 in the subsequent phase 0 (which is considered part of T cycle in signal diagram 1200). Similarly, the ambient light measurement of phase 0 during T+1 cycle as shown in signal diagram 1200 is used to determine whether to turn on IR LED 616 in the subsequent phase 0 (which is considered part of T+1 cycle, and not shown in signal diagram 1200). T−1 cycle is the very first cycle in the example of FIG. 12 (e.g., occurs after a cold start or reset), and only includes phase 0. Accordingly, the LED 616 is simply be turned on for phase 0 of T−1 cycle by default in this example.

In phase 2, IR LED 606 illuminates the environment of proximity sensor 600 and photodiode 610 measures the combination of ambient light in the environment of proximity sensor 600 and reflected IR illumination from IR LED 606, including reflected IR light 608 from object 602 in this example. The measurement of reflected IR illumination from IR LED 606, including reflected IR light 608 from object 602, is determined by subtracting the measured ambient IR light from phase 1 from the total measured IR light from phase 2.

By priming photodiode 610 in phase 0 under dark conditions, the "drooping" effect on the measurements during phase 0 and phase 2 under dark conditions is avoided or reduced. This can have the advantage of increasing the accuracy of proximity sensor 600 under dark conditions. By not priming photodiode 610 in phase 0 if ambient light illumination is great enough to produce sufficient charge carriers in photodiode 610, IR LED 616 is not turned on unnecessarily. This can have the advantage of saving power in some cases. By using the ambient light sensing of a previous cycle to determine whether to turn on IR LED 616, power is not consumed for ambient light sensing in phase 0.

In some implementations, the priming and detection phases do not cycle continuously, but rather, repeat after a delay. This can have the advantage of saving power and/or avoiding visual artifacts on display screen 612 in some circumstances, e.g., where slower proximity detection is acceptable. For example, the detection period 1202 between priming and detection cycles may be extended (e.g., by a desired number of clock cycles) in some implementations.

Figure 13:
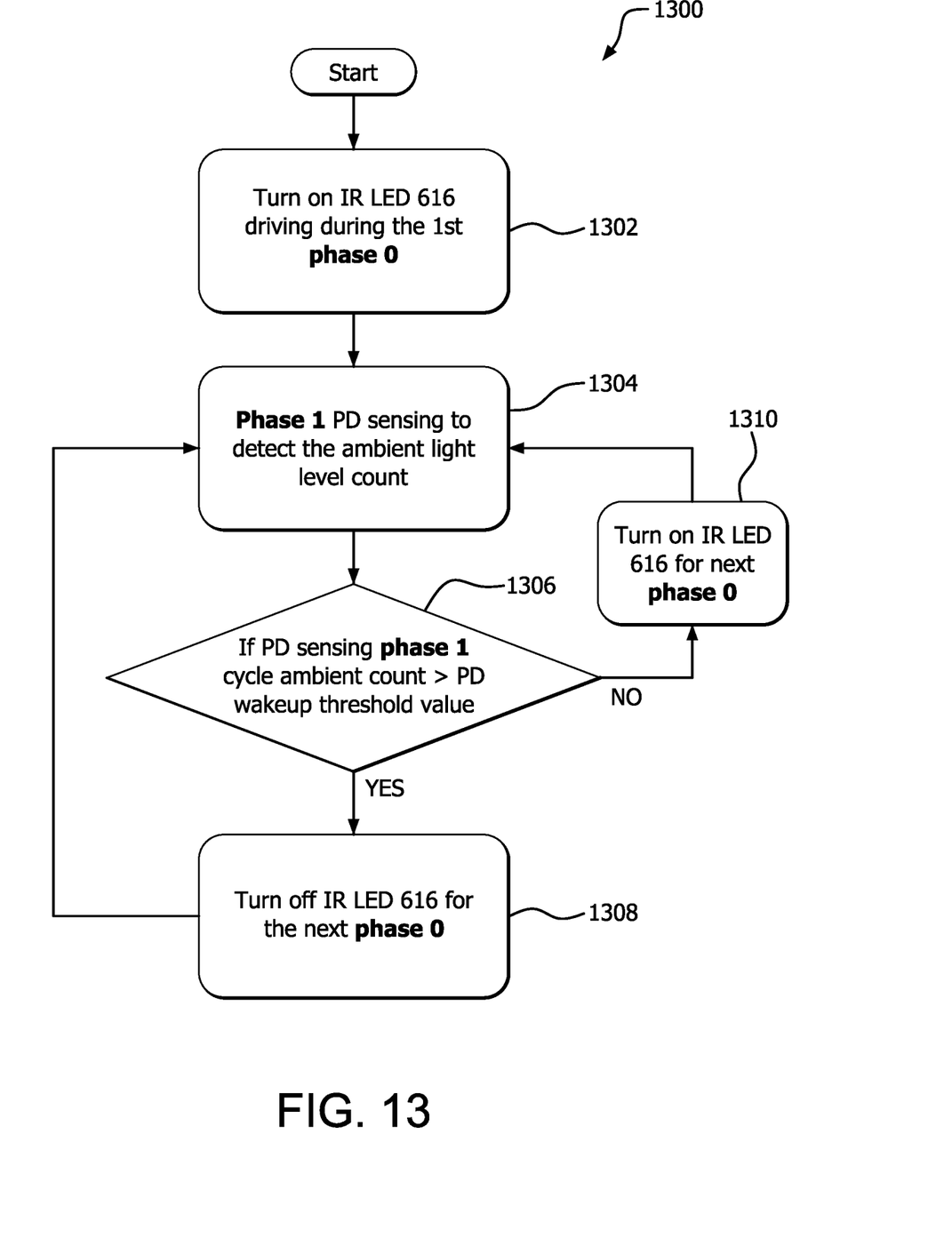
FIG. 13 is a flowchart illustrating an example method 1100 for operation of the photodiode and IR LEDs of FIG. 6.

FIG. 13 is a flowchart illustrating an example method 1100 for operation of the photodiode and IR LEDs of FIG. 6. Method 1300 illustrates the example operation of phase 0 as illustrated in FIG. 12. In step 1302, IR LED 616 is turned on during the first phase 0 by default. It is noted that in some implementations, IR LED 616 is turned off by default, or handled in any other desired way for the first cycle.

In step 1304, photodiode 610 senses ambient light during phase 0 of the first full cycle (T cycle as shown in FIG. 12). On condition 1106 that the ambient light sensed during phase 0 is greater than a wakeup threshold, IR LED 616 is turned off for the next phase 0 in step 1308. On condition 1106 that the ambient light sensed during phase 0 is not greater than the threshold, IR LED 616 is turned on for the next phase 0 in step 1310.

It should be understood that many variations are possible based on the disclosure herein. Although features and elements are described above in particular combinations, each feature or element can be used alone without the other features and elements or in various combinations with or without other features and elements.

The various functional units illustrated in the figures and/or described herein (including, but not limited to, the processor 102, the input driver 112, the input devices 108, the output driver 114, the output devices 110, the light sensor 202, the processor 206, or the display 204) may be implemented as a general purpose computer, a processor, or a processor core, or as a program, software, or firmware, stored in a non-transitory computer readable medium or in another medium, executable by a general purpose computer, a processor, or a processor core. The methods provided can be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer readable media). The results of such processing can be maskworks that are then used in a semiconductor manufacturing process to manufacture a processor which implements features of the disclosure.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A proximity sensor comprising:
a first light emitter;
a second light emitter; and
a light detector;
the first light emitter configured to emit light for a first time period while the light detector is not sensing; and
the second light emitter configured to emit light during a second time period while the light detector is sensing.

2. The proximity detector of claim 1, further comprising a housing which allows direct illumination of the light detector by the first light emitter, and which obstructs direct illumination of the light detector by the second light emitter.

3. The proximity detector of claim 1, further comprising a housing which obstructs illumination of a display by the first light emitter, and which obstructs direct illumination of the light detector by the second light emitter.

4. The proximity detector of claim 1, wherein the first light emitter is configured to emit light during the first time period such that the light detector maintains a linear responsivity during the second time period.

5. The proximity detector of claim 1, wherein the light detector comprises a photodiode or phototransistor.

6. The proximity detector of claim 1, wherein the first light emitter and the second light emitter comprise light emitting diodes.

7. The proximity detector of claim 1, wherein the light comprises infrared light.

8. A method for sensing proximity, the method comprising:

emitting light, by a first light emitter, for a first time period while a light detector is not sensing; and emitting light, by a second light emitter, for a second time period while the light detector is sensing.

9. The method of claim 8, wherein the first light emitter directly illuminates the light detector during the first time period, and wherein the second light emitter is obstructed from directly illuminating the light detector during the second time period.

10. The method of claim 8, wherein the first light emitter is obstructed from illuminating a display during the first time period, and wherein the second light emitter is obstructed from directly illuminating the light detector during the second time period.

11. The method of claim 8, wherein the first light emitter emits the light during the first time period such that the light detector maintains a linear responsivity during the second time period.

12. The method of claim 8, wherein the light detector comprises a photodiode or phototransistor.

13. The method of claim 8, wherein the first light emitter and the second light emitter comprise light emitting diodes.

14. The method of claim 8, wherein the light comprises infrared light.

15. Means for sensing proximity, comprising:
first light emitting means for emitting a first light;
second light emitting means for emitting a second light; and
light detecting means for detecting light;
the first light emitting means configured to emit light for a first time period while the light detecting means is not sensing; and
the second light emitting means configured to emit light during a second time period while the light detecting means is sensing.

16. The proximity detector of claim 1, further comprising a light obstruction means which allows direct illumination of the light detecting means by the first light emitting means, and which obstructs direct illumination of the light detecting means by the second light emitting means.

17. The proximity detector of claim 1, further comprising a light obstruction means which obstructs illumination of a display by the first light emitting means, and which obstructs direct illumination of the light detecting means by the second light emitting means.

18. The proximity detector of claim 1, wherein the first light emitting means is configured to emit light during the first time period such that the light detecting means maintains a linear responsivity during the second time period.

19. The proximity detector of claim 1, wherein the light detecting means comprises a photodiode or phototransistor.

20. The proximity detector of claim 1, wherein the first light emitting means and the second light emitting means comprise light emitting diodes.

* * * * *